(12) United States Patent
Giboney

(10) Patent No.: US 6,831,309 B2
(45) Date of Patent: Dec. 14, 2004

(54) UNIPOLAR PHOTODIODE HAVING A SCHOTTKY JUNCTION CONTACT

(75) Inventor: Kirk S. Giboney, Santa Rosa, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 10/322,986

(22) Filed: Dec. 18, 2002

(65) Prior Publication Data

US 2004/0119129 A1 Jun. 24, 2004

(51) Int. Cl.$^7$ .......................... H01L 31/0304
(52) U.S. Cl. .............. 257/184; 257/189; 257/191; 257/449; 257/453
(58) Field of Search .................. 257/184, 185, 257/189, 191, 449, 453

(56) References Cited

U.S. PATENT DOCUMENTS

| | | | |
|---|---|---|---|
| 5,652,435 A | * 7/1997 | Martin et al. | 257/184 |
| 5,818,096 A | * 10/1998 | Ishibashi et al. | 257/458 |
| 6,104,074 A | * 8/2000 | Chen | 257/453 |

OTHER PUBLICATIONS

John E. Bowers and Charles A. Burrus, Jr., "Ultrawide-Band Long–Wavelength p–i–n Photodetectors," Journal of Lightwave Technology, vol. LT–5, No. 10, Oct. 1987, pp. 1339–1350.

Tadao Ishibashi et al., "InP/InGaAs Uni–Traveling–Carrier Photodiodes," IEICE Trans. Electron., vol. E83–C, No. 6, Jun. 2000, pp. 938–949.

Kazutoshi Kato, "Ultra–Band/High–Frequency Photodetectors," IEEE Trans. on Microwave Theory and Techniques, vol. 47, No. 7, Jul. 1999, pp. 1265–1281.

N. Emeis, H. Schumacher, and H. Beneking, "High–Speed GaInAs Schottky Photodetector," Electronic Letters, vol. 21, No. 5, Feb. 1985, pp. 180–181.

Kirk S. Giboney, "Travelling–Wave Photodetectors," Doctoral Dissertation, University of California, Santa Barbara, Aug. 1995, Chapter 6, Sections 6.1 and 6.2, pp. 123–127.

* cited by examiner

*Primary Examiner*—Gene M. Munson

(57) ABSTRACT

A unipolar photodiode and methods of making and using employ a Schottky contact as a cathode contact. The Schottky cathode contact is created directly on a carrier traveling or collector layer of the unipolar photodiode resulting in a simpler overall structure to use and make. The unipolar photodiode comprises a light absorption layer, the collector layer adjacent to the light absorption layer, the Schottky cathode contact in direct contact with the collector layer, and an anode contact either directly or indirectly interfaced to the light absorption layer. The light absorption layer has a doping concentration that is greater than a doping concentration of the collector layer. The light absorption layer has a band gap energy that is less than that of the collector layer. The light absorption layer and the collector layer may be of the same or opposite conduction type.

24 Claims, 9 Drawing Sheets

UNIPOLAR PHOTODIODE HAVING A SCHOTTKY JUNCTION CONTACT

TECHNICAL FIELD

The invention relates to photodiodes used in optical network receivers. In particular, the invention relates to photodiodes having a unipolar or uni-traveling-carrier structure.

BACKGROUND ART

Semiconductor photodetectors, most notably various forms of photodiodes, absorb incident light in the form of photons and convert the absorbed photons into an electric current. The current within a lattice of the semiconductor is often represented in terms of 'free carriers' or simply 'carriers'. In particular, when a photon with sufficient energy interacts with an atom of the semiconductor lattice, an electron associated with the atom moves across an energy band gap from a valence shell or band to a conduction shell or band of the semiconductor. Movement of the electron across the band gap creates a negative carrier, i.e., the electron, and leaves behind a positive carrier known as a 'hole'. After carrier generation through photon absorption, a carrier transport mechanism within the semiconductor-based photodetector separates the generated holes and electrons, thereby creating an electric current known generally as a photocurrent. In general, both the electron and the hole may act as carriers within the semiconductor and contribute to the photoelectric current. The photocurrent thus created enables the photodetector to interact in various ways with an external circuit or system. Among other things, photodiodes find wide-scale application in optical receivers used for optical communication networks.

Photodetector performance is often summarized in terms of bandwidth, efficiency, maximum current output, and optical wavelength range. Bandwidth is a measure of a speed of response of the photodetector to changes in an incident optical signal or light source. Efficiency measures how much of the incident optical signal is converted into carriers. Maximum current output is typically determined by a saturation condition within the semiconductor of the photodetector while optical wavelength range is a function of certain material properties of the photodetector among other things. In general, photodetector performance is limited by a combination of material properties of constituent materials of the photodetector and a structural characteristic of the photodetector associated primarily with a type and/or structure of a given photodetector.

For example, FIG. 1A illustrates a cross section of a conventional positive-intrinsic-negative (PIN) photodiode 10. The PIN photodiode 10 comprises an intrinsic or lightly doped semiconductor layer 14 (i-layer) sandwiched between a p-type semiconductor layer 12 (p-layer) and an n-type semiconductor layer 15 (n-layer). The i-layer 14 is often referred to as a photo-active or a light absorption layer 14 since ideally, photon absorption is primarily confined to the i-layer 14 of the PIN diode 10. Typically a deposited metal, such as aluminum (Al), or another conductive material, such as heavily doped polysilicon, form a pair of ohmic contacts 17a, 17b, that provide an electrical connection between the PIN photodiode and an external circuit. The ohmic contact 17a connected to the p-layer is called an anode contact 17a while the ohmic contact 17b connected to the n-layer is referred to as a cathode contact 17b. Typically, the PIN photodiode 10 is formed on and structurally supported by a semi-insulating substrate 19.

FIG. 1B illustrates a band diagram 20 of the PIN photodiode 10 illustrated in FIG. 1A. The band diagram 20 depicts energy levels as electron-volts (eV) in a vertical or y-direction and physical length or distance along a conduction path within a device in a horizontal or x-direction. Thus, the band diagram 20 illustrates a valence band energy level 21 and a conduction band energy level 22 separated by a band gap 23 for each of the layers of the PIN photodiode 10. When a hole 30 and electron 32 are separated by the absorption of a photon by the photo-active i-layer 14, the hole 30 moves in the i-layer 14 to the p-layer 12 under the influence of an electric potential gradient formed by an inherently lower energy level of the p-layer 12 for holes. Once the hole reaches the p-layer 12, the hole combines with an electron supplied by the external circuit (not illustrated). The electron 32 moves in the i-layer 14 toward the n-layer 15 under the influence of an electric potential gradient formed by the inherently lower energy level of the n-layer 15 for electrons. Electrons in the n-layer 15 enter the cathode contact (not illustrated). The drift or movement of electrons 32 and holes 30 in the i-layer 14 drives an electric current in the n-layer 15, the p-layer 12, and the external circuit.

Among the performance limitations associated with the conventional PIN photodiode is a bandwidth limitation due to the time required for the transport of holes 30 and electrons 32 within the i-layer 14. In particular, holes 30 are known to have a much slower transport velocity than that of electrons 32. The slower transport velocity of holes 30 results in a transport time for the holes 30 that is much longer than a transport time of the electrons 32. The longer hole transport time normally dominates and ultimately limits an overall response time or bandwidth of the PIN photodiode 10.

Accordingly, it would be advantageous to have a photodiode that overcomes the bandwidth limitation associated with hole transport time. Moreover, it would be advantageous if such a photodiode were similar in complexity to the PIN photodiode and provided good efficiency. Such a photodiode would solve a longstanding need in the area of photodiodes for optical networking.

SUMMARY OF THE INVENTION

The present invention provides a unipolar or uni-traveling-carrier (UTC) photodiode that employs a Schottky contact (SC) as a cathode contact. In particular, the present invention provides a metal Schottky contact directly on a collector layer or intrinsic layer (i-layer) of the photodiode. The Schottky cathode contact on the i-layer is substituted for an n-type semiconductor layer in contact with an i-layer of a conventional UTC PIN photodiode.

In an aspect of the invention, a unipolar photodiode is provided. The unipolar photodiode comprises a first semiconductor or light absorption layer in a first conduction type having a first doping concentration. The light absorption layer has a band gap energy that facilitates light absorption. The unipolar photodiode further comprises a second semiconductor or collector layer having a second doping concentration and a collector band gap energy. The light absorption layer is adjacent to and in contact with a first side of the collector layer. The collector band gap energy is greater than the light absorption band gap energy, such that the collector layer is relatively non-conducive to light absorption. The unipolar photodiode further comprises a Schottky cathode contact adjacent to and in contact with a second side of the collector layer. The second side is opposite the first side. The unipolar photodiode further comprises an anode contact indirectly interfaced to the light absorption layer.

In other aspects of the present invention, a method of detecting incident light using the unipolar photodiode and a method of constructing the unipolar photodiode of the present invention are provided.

The present invention provides a simpler UTC or unipolar photodiode construction than that of the conventional UTC photodiode, yet provides a saturation current equivalent to that of the conventional UTC photodiode. Moreover, while simpler than the conventional UTC photodiode, the SC-UTC photodiode of the present invention exhibits improved bandwidth and efficiency relative to the conventional UTC photodiode. Furthermore in some embodiments, an order of the layers within the Schottky contact unipolar photodiode of the present invention is advantageously reversed compared to that of the conventional UTC PIN photodiode facilitated, in part, by the use of the Schottky cathode contact according to the present invention. Certain embodiments of the present invention have other advantages in addition to and in lieu of the advantages described hereinabove. These and other features and advantages of the invention are detailed below with reference to the following drawings.

BRIEF DESCRIPTION OF THE DRAWINGS

The various features and advantages of the present invention may be more readily understood with reference to the following detailed description taken in conjunction with the accompanying drawings, where like reference numerals designate like structural elements, and in which.

MODES FOR CARRYING OUT THE INVENTION

Figure 1A:
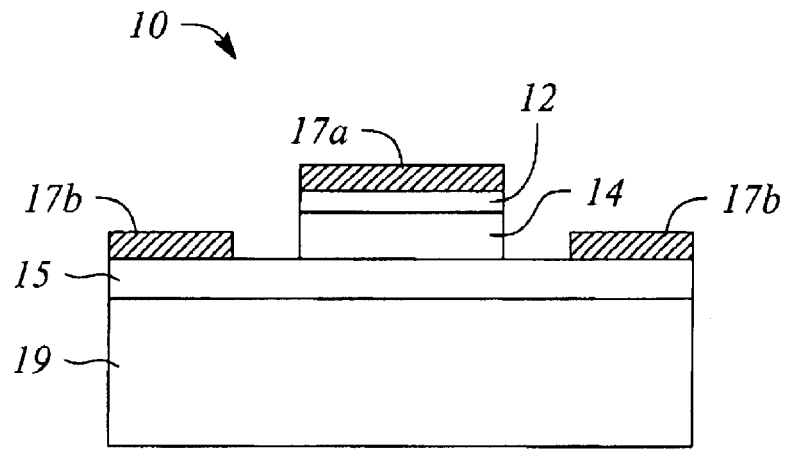
FIG. 1A illustrates a cross sectional view of a conventional vertically illuminated positive-intrinsic-negative (PIN) photodiode.
Figure 1B:
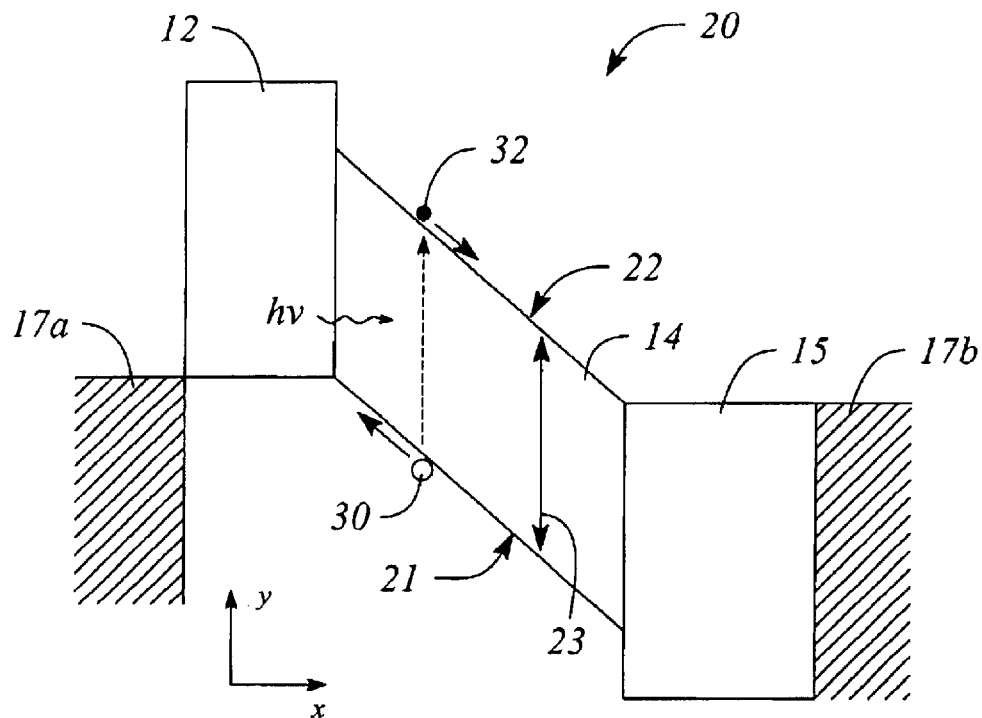
FIG. 1B illustrates a band diagram for the PIN photodiode illustrated in FIG. 1A.
Figure 2A:
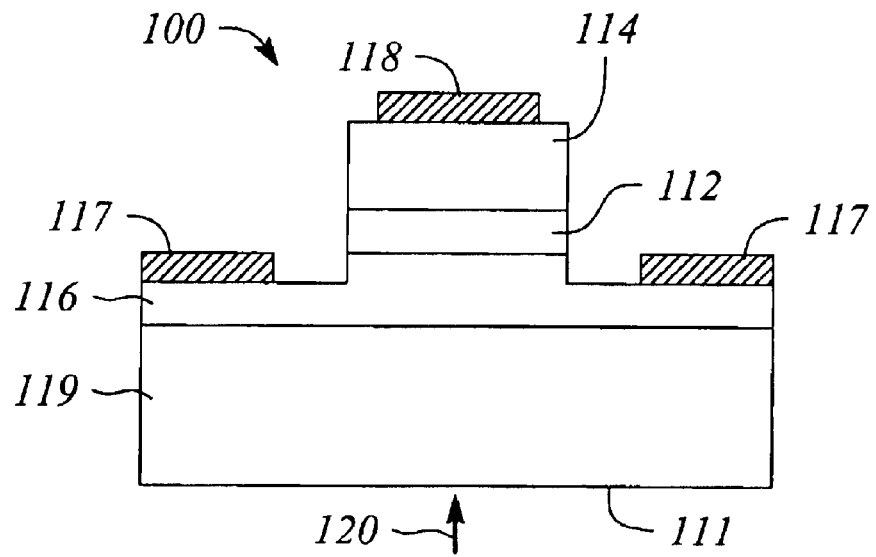
FIG. 2A illustrates a cross sectional view of a vertically illuminated Schottky contact unipolar photodiode according to an embodiment of the present invention.
Figure 2B:
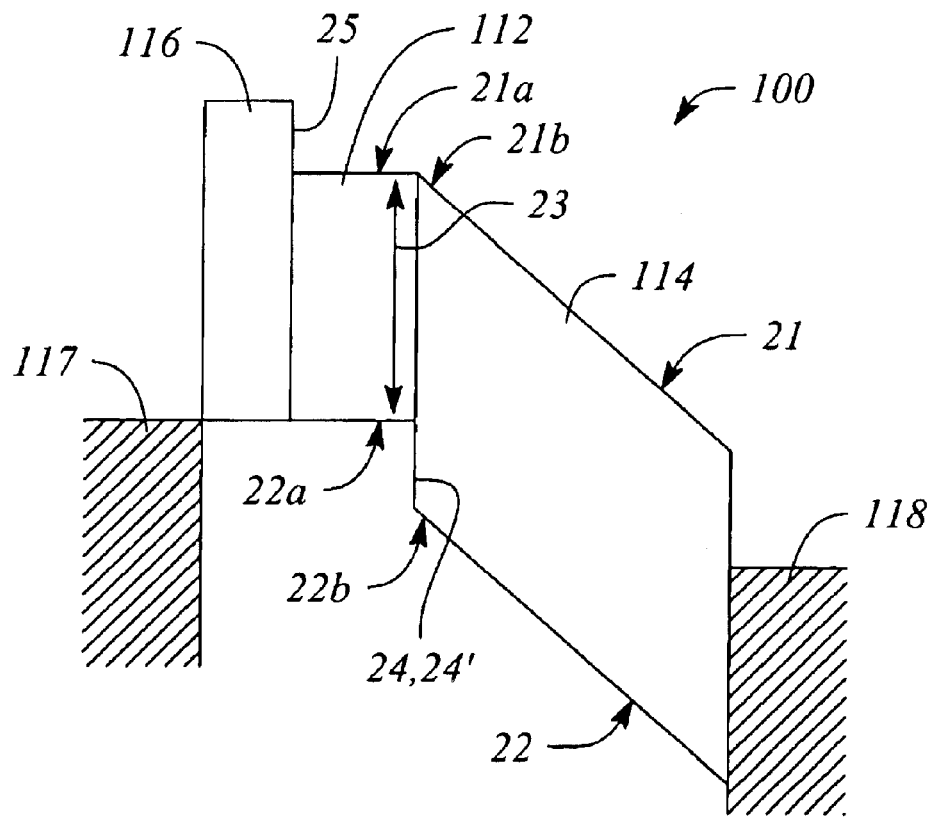
FIG. 2B illustrates a band diagram for the Schottky contact unipolar photodiode embodiment illustrated in FIG. 2A.

FIG. 2A illustrates a cross sectional view of a vertically illuminated Schottky contact unipolar photodiode 100 according to an embodiment, of the present invention. FIG. 2B illustrates a band diagram for the Schottky contact unipolar photodiode 100 embodiment illustrated in FIG. 2A. Although illustrated and described as a vertically illuminated photodiode for the purposes of discussion hereinbelow, vertical illumination is not intended to limit the scope of the present invention in any way. For example, one skilled in the art may readily manufacture the Schottky contact unipolar photodiode 100 in the form of a horizontally illuminated or waveguide photodiode without undue experimentation given the discussion hereinbelow.

The Schottky contact unipolar photodiode 100 comprises a light absorption layer 112, a carrier-traveling or collector layer 114 affixed to a side of the light absorption layer 112, a carrier block layer 116 affixed to a side of the light absorption layer 112 opposite the side to which the collector layer 114 is affixed, and a Schottky metal contact 118 connected directly to and covering a portion of a surface of the collector layer 114 opposite a side of the collector layer 114 that is connected to the light absorption layer 112. The Schottky contact unipolar photodiode 100 further comprises an ohmic contact 117 connected to the carrier block layer 116. The Schottky metal contact 118 serves as a cathode contact while the ohmic contact 117 functions as an anode contact for the Schottky contact unipolar photodiode 100 according to the present invention. In some embodiments, the Schottky contact unipolar photodiode 100 may be mounted or formed on a supporting surface of a semi-insulating substrate 119.

The light absorption layer 112 is a semiconductor of a first conduction type, for example, a p-type semiconductor. The semiconductor of the light absorption layer 112 preferably has a band gap that facilitates light absorption/conversion in an optical wavelength range of interest. In addition, the light absorption layer 112 semiconductor has a doping concentration sufficient to maintain charge neutrality in at least part of the layer 112 under a biased state or condition. In other words, the semiconductor of the light absorption layer 112 is chosen such that the band gap energy is less than or approximately equal to a mean or an average energy (e.g., hv) of an incident photon. Moreover, when an electrical bias is applied to the Schottky contact unipolar photodiode 100, the doping concentration of the layer 112 is such that the carriers are essentially undepleted within at least a portion of the light absorption layer 112. While the photodiode 100 may be operated with a bias of zero volts (V), such as when an output current level is low, preferably the light absorption layer 112 remains essentially undepleted within at least a portion of the light absorption layer 112 when a reverse bias of up to a breakdown voltage of the photodiode 100 is applied to the photodiode 100.

Thus for example, the light absorption layer 112 may be a III-V compound semiconductor such as, but not limited to, gallium-aluminum-arsenide (GaAlAs) doped with a p-type dopant. Other potentially suitable p-type doped III-V semiconductors for use as the light absorption layer 112 include, but are not limited to, indium-phosphide (InP) or materials lattice-matched to InP, gallium-arsenide-antimonide (GaAsSb), Gallium-indium-arsenide (GaInAs), aluminum-gallium-arsenide-antimonide (AlGaAsSb), aluminum-gallium-indium-arsenide (AlGaInAs), gallium-indium-arsenide-phosphide (GaInAsP). Such p-type III-V compound semiconductors and related materials are known to have band gaps that are suitable for use as the light absorption layer 112. Moreover, doping concentrations sufficient to allow such semiconductors to remain essentially undepleted under bias conditions may be readily achieved in practice. For example, for $Ga_{0.47}In_{0.53}As$ used as the light absorption layer 112, a doping concentration of approximately $p=2\times10^{17}$ may be used. One skilled in the art can readily determine and produce a suitable doping concentration without undue experimentation.

The collector layer 114 of the photodiode 100 is a semiconductor having a dopant concentration that is lower than that of the light absorption layer 112. Moreover, the semiconductor of the collection layer 114 preferably has a band gap that is greater than that of the light absorption layer 112. In some embodiments, the collector layer 114 is a lightly doped or undoped semiconductor and is essentially similar to an intrinsic layer (i-layer) of a conventional PIN photodiode 10 in that it supports the drift or transport field, and thus is identified with an intrinsic layer (i-layer) 14.

As mentioned hereinabove, the collector layer 114 preferably has a band gap that is greater than that of the light absorption layer 112. Additionally, a small offset of the conduction band energy of the light absorption layer 21a relative to the conduction band energy of the collector layer 21b often is desirable to facilitate movement of electrons from the light absorption layer 112 into the collector layer 114. As a result, there is a mismatch 24' in the valence band energy levels 22 between the light absorption layer 112 and the collector layer 114. The mismatch 24' manifests itself as an abrupt change from a relatively higher valence energy level 22a within the light absorption layer 112 to a lower valence energy level 22b just inside the collector layer 114. The presence of the mismatch 24' prevents or impedes holes generated and/or present in the light absorption layer 112 from entering the collector layer 114. Thus, the mismatch 24' acts a barrier 24 to the movement of holes into the collector layer 114.

However, while the mismatch 24' acts as the barrier 24, the barrier 24 is neither essential nor necessary according to the present invention since the field in the collector layer 114 naturally opposes the movement of holes into the collector layer 114. As such, when holes are generated, the holes preferentially drift and/or diffuse (i.e., move) away from the collector layer 114 and toward the carrier block layer 116 and the ohmic contact 117. Holes also move away from the collector layer 114 and toward the carrier block layer 116 and the ohmic contact 117 in small fields generated by the photocurrent such that current continuity is maintained throughout the photodiode 100.

As with the light absorption layer 112, the collector layer 114 may be a III-V compound semiconductor. However, as already noted, the collector layer 114 has a lower doping concentration and higher bandgap energy than that of the light absorption layer 112. Thus, the collector layer 114 may be a lightly doped or undoped, semiconductor such as, but not limited to, indium phosphide (InP). Other materials suitable for the collector layer 114 include, but are not limited to, undoped or lightly doped materials that are lattice matched to InP, undoped or lightly doped gallium-arsenide-antimonide (GaAsSb), undoped or lightly doped gallium-indium-arsenide (GaInAs), undoped or lightly doped aluminum-gallium-arsenide-antimonide (AlGaAsSb), undoped or lightly doped aluminum-gallium-indium-arsenide (AlGaInAs), undoped or lightly doped gallium-indium-arsenide-phosphide (GaInAsP). For example, given that the collector layer 114 preferably has a larger band gap than that of the light absorption layer 112, if GaInAs is employed as the light absorption layer 112 semiconductor in an exemplary photodiode 100 of the present invention, then InP may be used for the collector layer 114 semiconductor.

In some embodiments, a conduction band matching layer (not illustrated) may be employed between the light absorption layer 112 and the collector layer 114 to reduce the heterojunction conduction band energy barrier that may form between the light absorption layer 112 and the collector layer 114. If a conduction band energy of the collector layer 114 is greater than that of the light absorption layer 112, then there will be a barrier to transport of electrons from the light absorption layer 112 into the collector layer 114. The conduction band matching layer may reduce the photodiode response time by effectively reducing this barrier and facilitating the movement of electrons from the light absorption layer 112 into the collector layer 114.

The conduction band matching layer may be a III-V compound semiconductor or combination of III-V compound semiconductors. The semiconductor(s) of the conduction band matching layer may be of a first conduction type, for example p-type and/or of a second conduction type, for example n-type. Thus for example, the conduction band matching layer may be a III-V compound semiconductor such as, but not limited to, a single gallium-indium-arsenide-phosphide (GaInAsP) layer or several layers of differing GaInAsP alloy compositions, each one being appropriately doped. Other potentially suitable doped III-V semiconductors for use as the conduction band matching layer include, but are not limited to, indium-phosphide (InP) or materials lattice-matched to InP, gallium-arsenide-antimonide (GaAsSb), Gallium-indium-arsenide (GaInAs), aluminum-gallium-arsenide-antimonide (AlGaAsSb), aluminum-gallium-indium-arsenide (AlGaInAs). One skilled in the art can readily determine and produce suitable semiconductor layers with appropriate doping concentrations for the conduction band matching layer without undue experimentation. A description of an application of such matching layers to high speed photodetectors is provided by Yih-Guei Wey et al, "110 GHz GaInAs/InP Double Heterostructure p-i-n Photodetectors," *J. Lightwave Technol.*, vol. 13, no. 7, pp. 1490-1499, July, 1995, incorporated herein by reference.

The carrier block layer 116 is a semiconductor of the first conduction type, for example a p-type semiconductor. The semiconductor of the carrier block layer 116 has a band gap that is greater than the band gap of the light absorption layer 112. The band gap of the carrier block layer 116 being greater than that of the light absorbing layer 112 at least reduces, and preferably greatly reduces or substantially prevents, a chance that free electrons created in the light absorption layer 112 will move in a direction of the carrier block layer 116. In particular, the band gap of the carrier block layer 116 acts a barrier 25 to movement of electrons from the light absorption layer 112 into the carrier block layer 116. As free carriers are created through photon absorption, the electrons preferentially flow away from the boundary. Thus, the carrier block layer 116 effectively directs electron flow toward the collector layer 114 and ultimately to the cathode contact 118.

In addition to directing the flow of electrons toward the collector layer 114, the relatively greater band gap of the carrier block layer 116 reduces a chance that a photon incident on the carrier block layer 116 will create a pair of free carriers within the layer 116. As such, the photo-generation of the carriers is essentially and preferentially confined to the light absorption layer 112. Moreover, the photocurrent consists mainly of photo-generated electrons flowing from the light absorption layer 112 through the collector layer 114 and into the Schottky contact 118.

As is the case for the collector layer 114 and light absorption layer 112, the carrier block layer 116 may be a p-type III-V compound semiconductor. As already noted, the carrier block layer 116 has a band gap that is greater than the band gap of the light absorption layer 112. In particular, the carrier block layer 116 may be a relatively heavily doped p-type III-V compound semiconductor, such as, but not limited to, gallium-indium-arsenide-phosphide (GaInAsP). Other suitable p-type heavily doped III-V semiconductors for use as the carrier block layer 116 include, but are not limited to, indium-phosphide (InP) or materials lattice-matched to InP, gallium-arsenide-antimonide (GaAsSb), Gallium-indium-arsenide (GaInAs), aluminum-gallium-arsenide-antimonide (AlGaAsSb), aluminum-gallium-indium-arsenide (AlGaInAs), gallium-aluminum-arsenide (GaATAs). For example, if $Ga_{0.47}In_{0.53}As$ with a doping concentration of approximately $p=2\times10^{17}$ is used as the light absorption layer 112, then $Ga_{0.27}In_{0.73}As_{0.6}P$ with a doping concentration preferably greater than $p=2\times10^{17}$ may be used as the carrier block layer 116. Given the discussion herein, one skilled in the art can readily determine a suitable choice of material for the carrier block layer 116 and a sufficient doping concentration without undue experimentation.

In some embodiments, a valence band matching layer (not illustrated) may be employed between the light absorption layer 112 and the carrier block layer 116 to reduce the heterojunction valence band energy barrier that may form between the light absorption layer 112 and the carrier block layer 116. An offset in the valence band energy between the light absorption layer 112 and the carrier block layer 116 will result in a barrier to transport of holes from the light absorption layer 112 into the carrier block layer 116 or from the carrier block layer 116 into the absorption layer 112. The valence band matching layer may reduce the series resistance by facilitating the movement of holes from the light absorption layer 112 into the carrier block layer 116.

The valence band matching layer may be a III-V compound semiconductor or combination of III-V compound semiconductors. The semiconductor(s) of the valence band matching layer may be of a first conduction type, for example p-type. Thus for example, the valence band matching layer may be a III-V compound semiconductor such as, but not limited to, a single gallium-indium-arsenide-phosphide (GaInAsP) layer or several layers of differing GaInAsP alloy compositions, each one appropriately doped. Other potentially suitable doped III-V semiconductors for use as the valence band matching layer include, but are not limited to, indium-phosphide (InP) or materials lattice-matched to InP, gallium-arsenide-antimonide (GaAsSb), Gallium-indium-arsenide (GaInAs), aluminum-gallium-arsenide-antimonide (AlGaAsSb), aluminum-gallium-indium-arsenide (AlGaInAs). The valence band matching layer is similar in concept to the conduction band matching layer described hereinabove. One skilled in the art can readily determine and produce suitable semiconductor layers with appropriate doping concentrations for the valence band matching layer without undue experimentation.

The Schottky contact 118 is a metal contact material on a surface of and in intimate contact with the collector layer 114. The metal contact material in intimate contact with the collector layer 114 forms a Schottky barrier at an interface or boundary between the metal material of the contact 118 and the lattice of the semiconductor of the collector layer 114. As such, the metal contact material forms the Schottky contact 118. The metal material of the Schottky contact 118 may be any metal used in semiconductor manufacture for producing a metal contact including, but not limited to, aluminum (Al), silver (Ag), gold (Au), or copper (Cu). One skilled in the art is familiar with Schottky contacts and the manufacture of and metal materials used therefor, all of which are within the scope of the present invention.

The ohmic contact 117 is an electrical contact that is adjacent to and interfaced with the carrier block layer 116. A metal ohmic contact 117 is formed using any electrically conductive metal including, but not limited to, aluminum (Al), silver (Ag), gold (Au), or copper (Cu). One skilled in the art is familiar with ohmic contacts and the manufacture of and metal materials used therefor, all of which are within the scope of the present invention.

The ohmic contact 117 may either directly or indirectly interfaced to the carrier block layer 116. When directly interfaced, ohmic contact 117 is formed by depositing metal or another suitable contact material on a surface of the carrier block layer 116. FIG. 2A illustrates an embodiment of a directly interfaced ohmic contact 117.

When indirectly interfaced, another layer may be employed between the ohmic contact 117 and the carrier block layer 116. The other layer may be employed to improve a performance of the ohmic contact 117 such as, but not limited to series resistance and/or contact 117 adhesion.

Figure 2C:
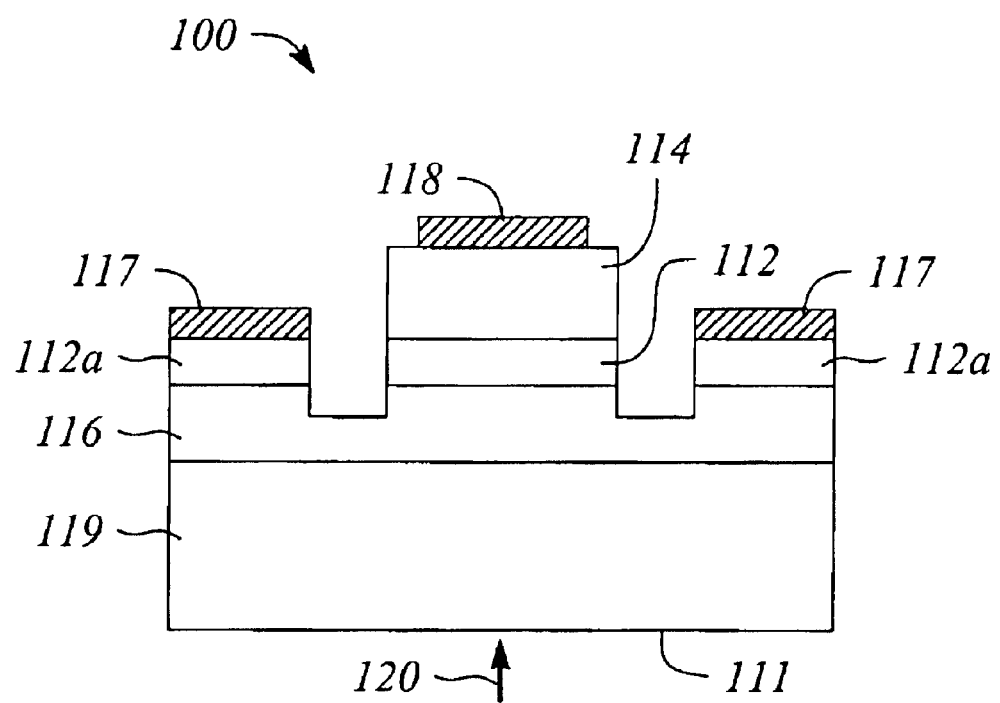
FIG. 2C illustrates a cross sectional view of a vertically illuminated Schottky contact unipolar photodiode having an indirectly interfaced ohmic contact 117 according to an embodiment of the present invention.

For example, a layer of heavily doped semiconductor material may used to indirectly connect the ohmic contact 117 to the carrier block layer 116. In another example, a portion 112a of a layer used to create the light absorption layer 112 may be physically separated from the light absorption layer 112 during processing to form the photodiode 100. The physically separated portion 112a may be then employed to indirectly interface the ohmic contact 117 to the carrier block layer 116. FIG. 2C illustrates a cross sectional view of a vertically illuminated Schottky contact unipolar photodiode having an indirectly interfaced ohmic contact 117 according to an embodiment of the present invention.

As mentioned, the use of another layer, such as but not limited to a separated portion 112a of the light absorption layer 112, may facilitate a lower resistance ohmic contact 117. In particular, it is often difficult to form a good, low resistance, ohmic contact 117 on a semiconductor material having a high band gap energy such as preferably is used in the carrier block layer 116. Indirect interfacing enables insertion of a material that is more conducive to forming an ohmic contact 117 with a lower overall resistance (e.g., materials with a lower band gap energy than that of the carrier block layer 116 ). Moreover, when the ohmic contact 117 is indirectly interfaced to the carrier block layer 116 using the separated portion 112a of the light absorption layer 112, the use of a valence band matching layer as described hereinabove may further reduce the series resistance. In particular in such an embodiment, the valence matching layer further reduces series resistance by facilitating the movement of holes from the carrier block layer 116 into the light absorption layer 112, thereby further reducing series resistance of the ohmic contact 117.

The vertically illuminated Schottky contact unipolar photodiode 100 as illustrated in FIG. 2A may be illuminated from a direction, hereinafter referred to as from 'below' the photodiode 100, which corresponds to a side 111 represented by a location of the semi-insulating substrate 119. In other words, reference to 'below' means the side 111 of the photodiode 100 that is opposite to a side of the photodiode 100 that comprises the Schottky contact 118. In particular, incident light 120 in the form of photons may enter the photodiode 100 from the below side 111 passing through the semi-insulating substrate 119. As such, the semi-insulating substrate 119 is preferably transparent or at least translucent to the incident light 120. Likewise, preferably the carrier block layer 116 is transparent or translucent to the incident light 120.

During illumination, photons pass through the semi-insulating substrate 119 and the carrier block layer 116 and enter the light absorption layer 112. Within the light absorption layer 112, the photons, having an energy $E_p$ approximately equal to hv, may impact atoms of the semiconductor lattice and generate a pair of free carriers (e.g., holes and electrons). As already described hereinabove, the electrons thus generated are directed preferentially to diffuse toward the collector layer 114, in part, by the presence and action of the carrier block layer 116 and the barrier 25 formed thereby. Upon entering the collector layer 114, the electrons are accelerated toward the Schottky contact 118 by an energy gradient and/or electric field in the collector layer 114. Upon reaching the Schottky contact 118, the electrons are absorbed by the contact 118. In particular, the electrons of the photocurrent may flow through an external circuit attached to the Schottky contact 118.

Similarly, the holes generated by absorption of a photon are directed preferentially to diffuse toward the carrier block layer 116 and therethrough to the ohmic contact 117. The principal drift or movement direction is due in large part to the presence of the energy mismatch barrier 24 at the collector layer 114 edge, as already described hereinabove. At the ohmic contact 117, the holes may combine or become filled with electrons supplied by the external circuit. In other words, the holes are essentially 'absorbed' by the ohmic contact 117. As such, the photocurrent is almost entirely a function of the electrons flowing from the light absorption layer 112 into the Schottky contact 118. Since the photocurrent is made up of only minority carriers (i.e., the electrons) which have a much higher mobility than the majority carriers (i.e., the holes), a response time of the photodiode 100 advantageously is reduced compared to that of the conventional PIN photodiode. In particular, the reduced response time results in an increased bandwidth for the Schottky contact unipolar photodiode 100 of the present invention relative to the conventional PIN photodiode.

Figure 3A:
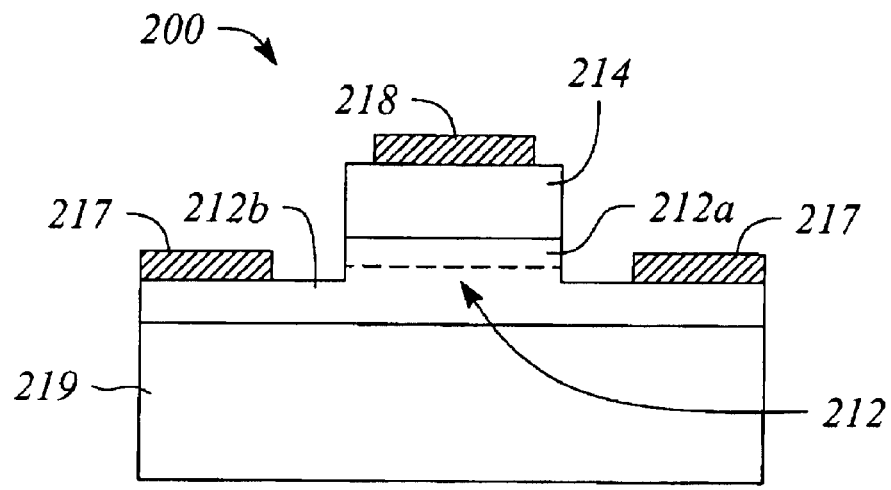
FIG. 3A illustrates a cross sectional view of the vertically illuminated Schottky contact unipolar photodiode according to another embodiment of the present invention.
Figure 3B:
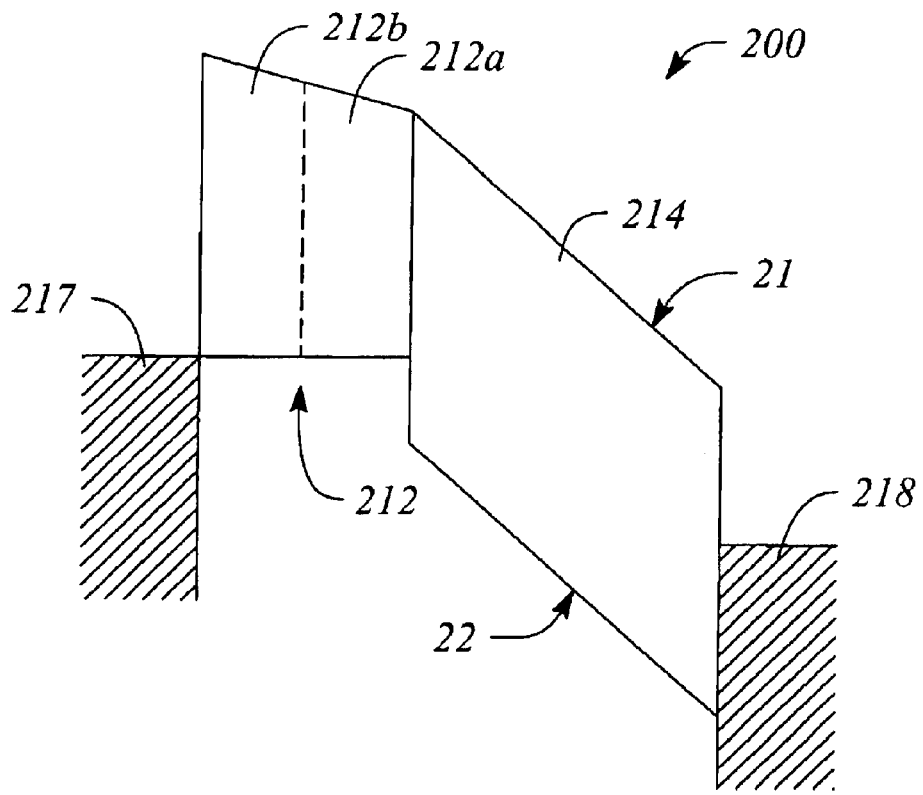
FIG. 3B illustrates a band diagram for the Schottky contact unipolar photodiode embodiment illustrated in FIG. 3A.

FIG. 3A illustrates a cross sectional view of a vertically illuminated Schottky contact unipolar photodiode 200 according to another embodiment of the present invention. In particular, the embodiment illustrated in FIG. 3A is a Schottky contact unipolar photodiode 200 comprising a light absorbing layer that has or produces a quasi-field within the layer. As used herein, a 'quasi-field' is an electric field created primarily through a controlled use of various materials within the layer wherein the created field essentially and preferentially acts only on minority carriers (e.g., electrons) within a neutrally charged layer (e.g., light absorption layer 212 ) of a semiconductor. FIG. 3B illustrates a band diagram for the Schottky contact unipolar photodiode 200 embodiment illustrated in FIG. 3A.

Although illustrated and described as a vertically illuminated photodiode for the purposes of discussion hereinbelow, vertical illumination is not intended to limit the scope of the present invention in any way. For example, one skilled in the art may readily produce the Schottky contact unipolar photodiode 200 that employs a quasi-field in the form of a horizontally illuminated or waveguide photodiode without undue experimentation according to the present invention.

The Schottky contact unipolar photodiode 200 comprises a light absorbing, 'graded band gap' layer 212, a carrier-traveling or collector layer 214 affixed to a side of the light absorption layer 212, and a Schottky metal contact 218 connected directly to and covering a portion of a surface of the collector layer 214. The surface of the collector layer 214 to which the Schottky contact 218 is connected is opposite the side of the collector layer 214 that is connected to the light absorption layer 212. The Schottky contact unipolar photodiode 200 further comprises an ohmic contact 217 connected to the graded band gap layer 212. The Schottky metal contact 218 serves as a cathode contact while the ohmic contact 217 functions as an anode contact for the Schottky contact unipolar photodiode 200 according to the present invention. In some embodiments, the Schottky contact unipolar photodiode 200 may be mounted or formed on a supporting surface of a semi-insulating substrate 219.

The collector layer 214 is essentially similar to the collector layer 114 described hereinabove with respect to the Schottky contact unipolar photodiode 100 and is connected to one side of the graded band gap layer 212. In particular, the collector layer 214 comprises a semiconductor that is lightly doped or undoped relative to a doping level of the graded band gap layer 212. Likewise, the ohmic contact 217, Schottky contact 218, and semi-insulating substrate 219 are essentially similar to the ohmic contact 117, the Schottky contact 118, and semi-insulating substrate 119, respectively, described hereinabove for the previous disclosed photodiode 100. In particular, the Schottky contact 218 is connected directly to a side of the collector layer 214 that is opposite the side connected to the graded band gap layer 212.

The Schottky contact unipolar photodiode 200 of the present embodiment differs from the Schottky contact unipolar photodiode 100 embodiment in that the graded band gap layer 212 replaces the light absorption layer 112. In particular, the graded band gap layer 212, or a portion thereof, absorbs incident light and converts photons therein into free carriers. Furthermore, the graded band gap layer 212 provides a quasi-field that directs a movement of minority carriers (e.g., electrons) toward the collector layer 214 and away from the ohmic contact 217. Advantageously as a result of the existence and action of the quasi-field, the carrier block layer 116 of the previously disclosed photodiode 100 embodiment may be omitted in the Schottky contact unipolar photodiode 200 of the present embodiment.

The graded band gap layer 212 comprises semiconductor material having a graded band gap. Moreover, the grading is 'towards' a side of the layer 212 connected to the collector layer 214. In other words, the band gap of the graded band gap layer 212 semiconductor material generally increases as a function of distance from the side of the layer 212 that is connected to the collector layer 214. As such, the band gap is generally smaller at the side of the graded band gap layer 212 connected to the collector layer 214 than at an opposite side. The graded band gap is depicted graphically as a gradual increase in an energy level difference between the conduction band level 21 and valence band level 22 within the graded band gap layer 212 in the band diagram illustrated in FIG. 3B. As with the light absorption layer 112 of the photodiode 100, the graded band gap layer 212 has a doping concentration (e.g., p-type doping) that exceeds a predetermined level such that at least a portion of the layer 212 is not depleted when the photodiode 200 is reversed biased.

The band gap grading may be created in practice by forming a III-V compound semiconductor layer in which a composition of the compound semiconductor is adjusted appropriately throughout a thickness of the layer 212. For example, if GaInAsP is employed to construct the graded band gap layer 212, ratios of the component elements, gallium, indium, arsenic, and phosphorous may be controlled and changed as a function of distance to effect a desired grading of the band gap while maintaining a desired lattice constant. Thus for example, a 100 meV or greater difference in band gap from one side of the graded band gap layer 212 to the other or opposite side may be produced by gradually varying the Ga/In/As/P ratio within the layer 212. One skilled in the art is familiar with forming semiconductor layers having graded band gaps.

A result of grading the band gap to decrease in a direction toward the collector layer 214 is that the quasi-field is created. In particular, minority carriers (e.g., electrons) preferentially move toward the collector layer 214 under the influence of the quasi-field. For example, a 100 meV difference in band gap across the graded band gap layer 212 produces a suitably strong quasi-field for directing the electron movement. Among other things, the quasi-field reduces a response time of the photodiode 200 by preferentially accelerating the free electrons created by light absorption within the graded band gap layer 212 in a direction of the collector layer 214.

In principle, the graded band gap layer 212 of the photodiode 200 embodiment illustrated in FIGS. 3A and 3B may be divided into a first region or portion 212 a and a second region or portion 212b. The first portion 212a is adjacent to the collector layer 214. The first portion 212a is a portion of the graded band gap layer 212 wherein the band gap is less than or equal to an approximate energy hv of an incident photon. The second portion 212b is adjacent to the semi-insulating substrate 219 when present. The band gap of the second portion 212b is generally greater than the energy of an incident photon within the second portion 212b. As a result, the first portion 212a essentially preferentially provides absorption of incident light with a concomitant generation of free carriers while the second portion 212b contributes relatively fewer free carriers through light absorption.

Thus, the first portion 212 a may be considered to be a light absorption portion 212a functionally equivalent to the light absorption layer 112 of the photodiode 100. The second portion 212b having a band gap that is generally higher than the band gap of the first portion 212a may be thought of as being functionally equivalent to the carrier block layer 116 of the photodiode 100. Of course, the entire graded band gap layer 212 as a whole actually acts to direct the electrons to move toward the collector layer 214 due to the presence of the quasi-field. Thus, with respect to the Schottky contact unipolar photodiode 200 embodiment, the entire graded band gap layer 212 essentially replaces the carrier block layer 116 of the photodiode 100.

Figure 4A:
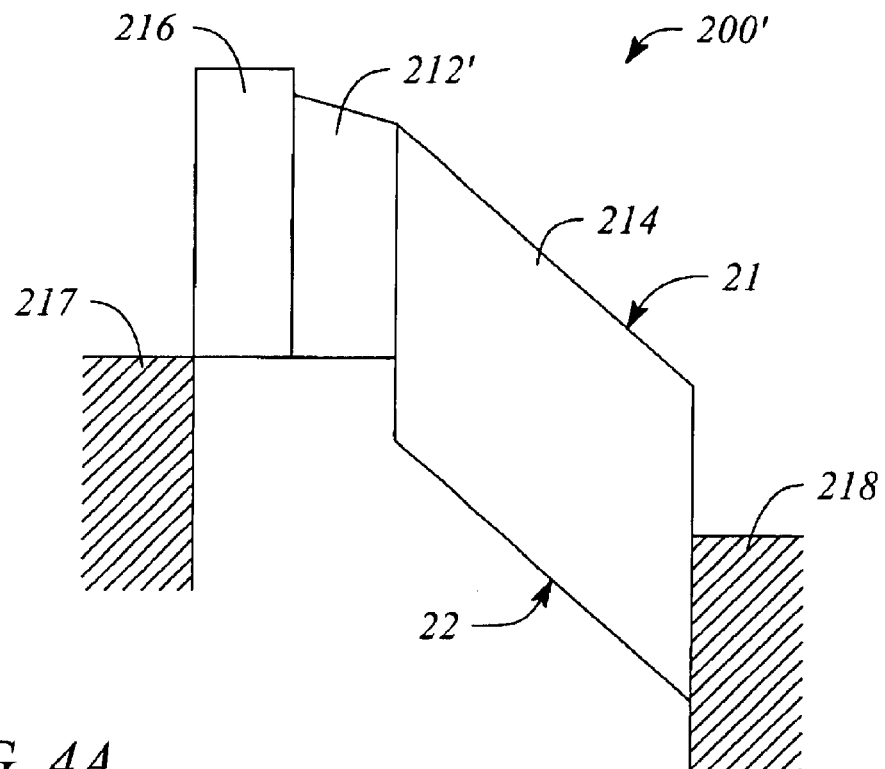
FIG. 4A illustrates a band diagram of a Schottky contact unipolar photodiode having both a graded band gap layer and a carrier block layer according to an embodiment of the present invention.

In other embodiments, a carrier block layer 216 may be used in addition to the graded band gap layer 212'. A band diagram of a Schottky contact unipolar photodiode 200' having a graded band gap layer 212' and further comprising a carrier block layer 216 is illustrated in FIG. 4A. In such embodiments, the carrier block layer 216 preferably has a band gap that is greater than that of a highest band gap in the graded band gap layer 212'. More preferably, the highest band gap of the graded band gap layer 212' is less than or equal to the energy of an incident photon, while the band gap of the carrier block layer 216 is greater than the energy of the incident photon.

Figure 4B:
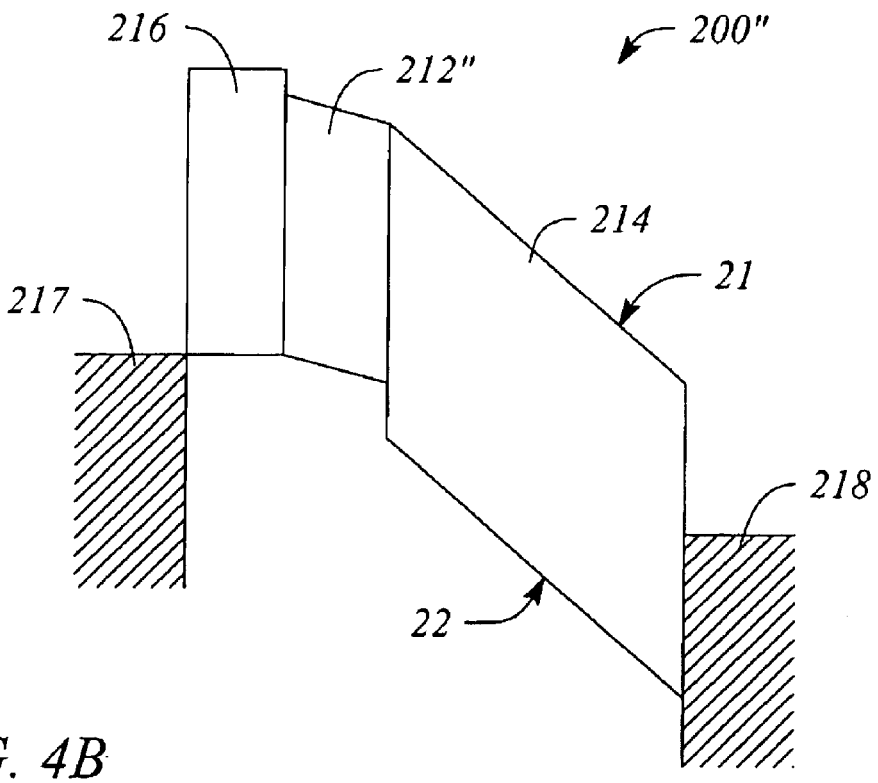
FIG. 4B illustrates a band diagram of another embodiment of a Schottky contact unipolar photodiode having a graded doping concentration layer according to the present invention.

In yet other embodiments, a Schottky contact unipolar photodiode 200" may be realized wherein the graded band gap layer 212, 212' is replaced with a layer 212" having a graded doping concentration (e.g., p-type). FIG. 4B illustrates a band diagram of the Schottky contact unipolar photodiode 200" that employs a graded doping concentration layer 212". The graded doping concentration layer 212" has a doping concentration that is graded towards the collector layer 214 in much the same way as the band gap of the graded band gap layer 212, 212' is graded toward the collector layer 214. Moreover, the graded doping concentration creates an electric field in which both electrons and holes move. The graded doping concentration layer 212" acts to direct the electrons to move toward the collector layer 214 due to the presence of the electric field. Also, the graded doping concentration layer 212" acts to direct the holes to move toward the block layer 216 due to the presence of the electric field. As with the band gap grading embodiments of the Schottky contact unipolar photodiode 200, 200' described hereinabove, the Schottky contact unipolar photodiode 200" employing the graded doping concentration layer 212" may be realized with or without (not illustrated) a carrier block layer 216 and still be within the scope of the present invention.

Figure 5A:
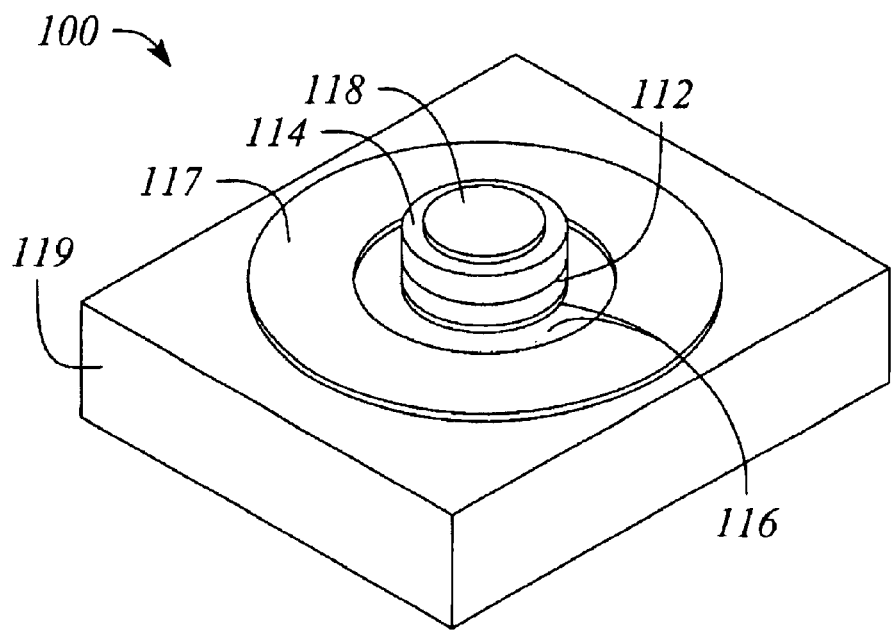
FIG. 5A illustrates a perspective view of an embodiment of the Schottky contact unipolar photodiode according to the present invention.

FIG. 5A illustrates a perspective view of an embodiment of the Schottky contact unipolar photodiode 100 according to the present invention. In particular, FIG. 5A illustrates an exemplary 'pillbox' or concentric-contact style embodiment of the Schottky contact unipolar photodiode 100 according to the present invention. For the purposes of discussion only, 'top', as used herein, means a side of the photodiode 100 comprising the Schottky contact 118, such as the orientation of the photodiode 100 in illustrated in FIG. 5A. Further, reference to 'bottom', as used herein, means a side of the photodiode 100 opposite to the top. As illustrated in FIG. 5A, the ohmic contact 117 that serves as the anode contact, lies on top of and is connected to the carrier block layer 116. Furthermore, the ohmic contact 117 is annularly disposed around a central stack portion of the photodiode 100. The central stack portion comprises a portion of the carrier block layer 116, the light absorption layer 112 on top of the carrier block layer 116, the collector layer 114 on top of the light absorption layer 112, and the Schottky contact 118 cathode contact at the top of the stack. FIG. 5A illustrates the photodiode 100 embodiment supported by the semi-insulating substrate 119. Incident light preferably enters the exemplary photodiode 100 from below, passing through the semi-insulating substrate 119, before entering the photodiode 100. A similar configuration to that illustrated for FIG. 5A may be used to construct the other embodiments 200, 200', 200" of the photodiode 200 described hereinabove.

Advantageously, in the vertically illuminated photodiode 100, 200, 200', 200" embodiment of FIG. 5A, light passes through the carrier block layer 116, 216 with little absorption. A fraction of the light is absorbed as it passes through light absorption layer 112, 212. The light then passes through the collector layer 114, 214 essentially without absorption and is then reflected by the Schottky metal contact 118, 218. The reflected light again passes through the photodiode layers but in a reverse direction. Upon passing through the light absorption layer 112, 212, a second time, more of the light is absorbed. As a result of the light reflecting from the Schottky metal contact 118, 218, more photocurrent is produced and the photodiode has higher efficiency than if there were no reflection.

Figure 5B:
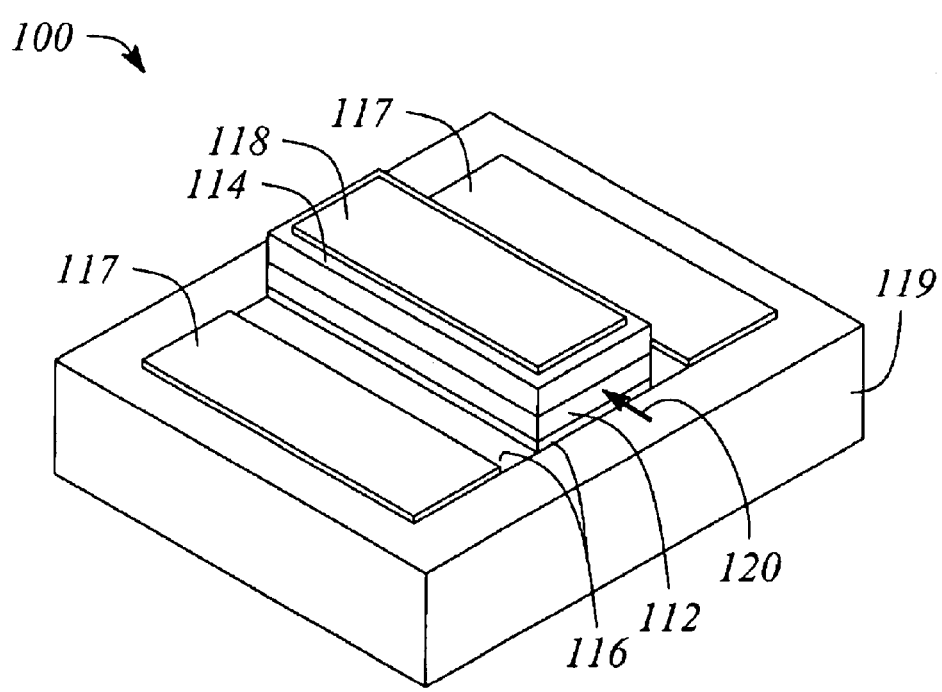
FIG. 5B illustrates a perspective view of another embodiment of the Schottky contact unipolar photodiode according to the present invention.

FIG. 5B illustrates a perspective view of another exemplary embodiment of the Schottky contact unipolar photodiode 100 according to the present invention. The exemplary embodiment illustrated in FIG. 5B is well suited for realizing a horizontally illuminated or waveguide photodiode as opposed to the primarily vertically illuminated application of the photodiode 100 embodiment illustrated in FIG. 5A. Incident light enters this exemplary embodiment of the photodiode 100 from below when vertically illuminated. When employed as a horizontally illuminated or waveguide photodiode, incident light preferably enters the light absorption layer 112 from a side. More preferably, incident light enters from a side that is perpendicular to a long dimension of the photodiode 100. An arrow 120 in FIG. 5B illustrates a path taken by incident light in an embodiment of the horizontally illuminated or waveguide photodiode. A similar configuration to that illustrated in FIG. 5B may be employed to construct the other embodiments 200, 200', 200" of the photodiode 200 described hereinabove according to the present invention.

As already described, the Schottky unipolar photodiode 100 according to the present invention may be operated in a reverse biased condition or state. In particular, the reverse bias may be applied to the photodiode 100 such that a reverse bias voltage appears across an interface between the Schottky contact 118 and the collector layer 114. Under such reverse bias conditions, such as when majority carriers are present in a part of the light absorption layer 112 and when an average current density $J_0$ is given, then a relationship may be specified between a thickness W of the layer 112 and a conductivity $\sigma$ of the layer 112. Specifically, if the conductivity a is constant, preferably the layer conductivity $\sigma$ and the layer thickness W satisfy a relationship given in equation (1)

$$\frac{J_0 \times W}{2\sigma} \leq \frac{\Delta E_{\Gamma-L}}{q} \quad (1)$$

where $\Delta E_{\Gamma-L}$ is Γ-valley/L-valley energy separation and q is an electron charge. In situations wherein the conductivity g is not constant but has a distribution, the layer conductivity $\sigma$ and the layer thickness W preferably satisfy a relationship given in equation (2)

$$\int_0^W \frac{J_0(W-x)}{W\sigma(x)} dx \leq \frac{\Delta E_{\Gamma-L}}{q} \quad (2)$$

where $\Delta E_{\Gamma-L}$ is Γ-valley/L-valley energy separation, q is an electron charge, and x is a position in the light absorption layer 112. A rationale for and description of these relationships is provided by Ishibashi et al., U.S. Pat. No. 5,818,096, incorporated herein by reference. Equations (1) and/or (2) may be similarly applied to the Schottky contact unipolar photodiode 200, 200', 200" by one skilled in the art without undue experimentation.

Figure 6A:
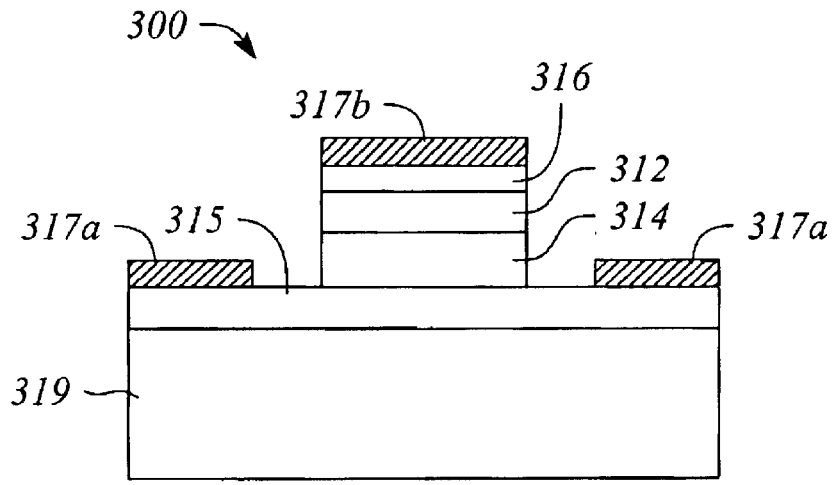
FIG. 6A illustrates a cross sectional view of a conventional vertically illuminated uni-traveling-carrier (UTC) photodiode.
Figure 6B:
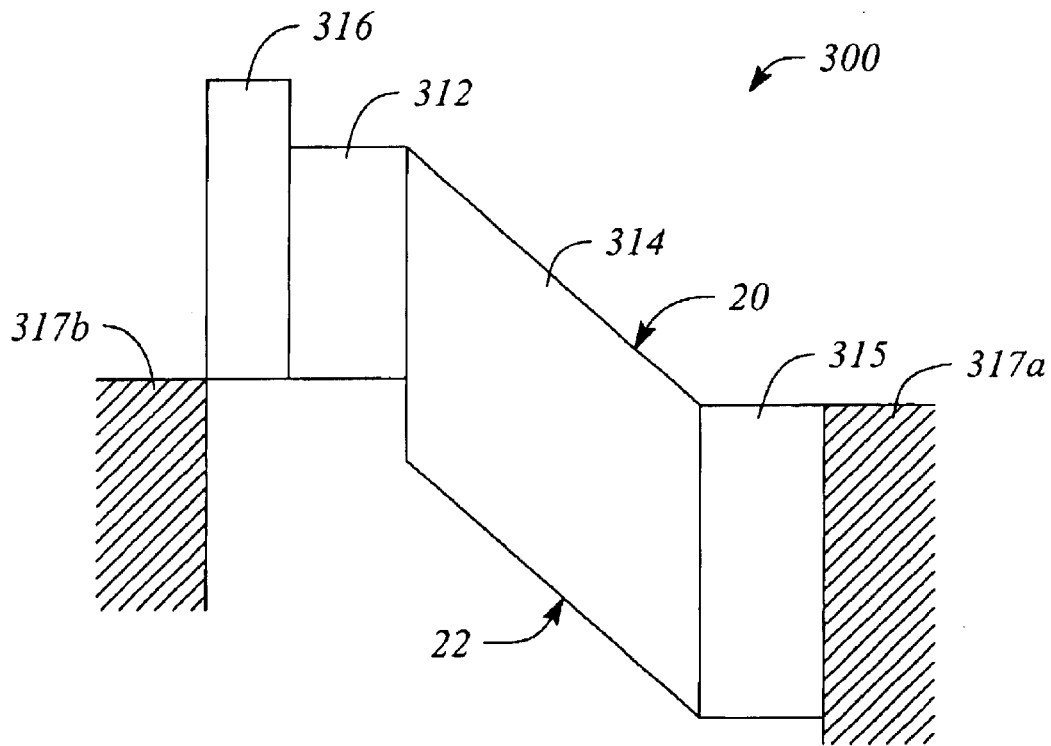
FIG. 6B illustrates a band diagram for the UTC photodiode illustrated in FIG. 6A.

FIG. 6A illustrates a cross sectional view of a conventional unipolar or uni-traveling-carrier (UTC) photodiode 300. FIG. 6B illustrates a band diagram of the conventional UTC photodiode 300. The conventional UTC-photodiode 300 comprises a light absorption layer 312, a carrier traveling or collector layer 314 connected to a first side of the light absorption layer 312 and a carrier block layer 316 connected to a second side of the light absorption layer 312, the second side being opposite the first side. The carrier traveling or collector layer 314 is adjacent and connected to an electrode layer 315. A cathode contact 317a is formed by connecting a first ohmic contact 317a to the electrode layer 315 that underlies the carrier traveling or collector layer 314. An anode contact 317b is formed by connecting a second ohmic contact 317b to the carrier block layer 316 at the top of the layer stack. Furthermore, the electrode layer 315 is a heavily doped semiconductor having a conduction type that differs from that of the light absorption layer 312. For example, if the light absorption layer 312 is a p-type semiconductor, the electrode layer 315 is a heavily doped n-type semiconductor. The conventional UTC photodiode is formed by stacking in succession the electrode layer 315 on top of a semi-insulating substrate 319, the carrier traveling or collector layer 314 on top of the electrode layer 315, the light absorption layer 312 on top of the carrier traveling or collector layer 314, and then carrier block layer 316 on top of the light absorption layer 312. The first ohmic contact 317a, or cathode contact, is connected to an exposed portion of the electrode layer 315 while the second ohmic contact 317b, or anode contact, is connected to the carrier block layer 316 at a top of the stack.

The Schottky contact unipolar photodiode 100, 200, 200', 200" of the present invention differs markedly from a conventional unipolar or uni-traveling-carrier (UTC) photodiode in several ways. In particular, the Schottky contact unipolar photodiode 100, 200, 200', 200" comprises a Schottky contact 118, 218 instead of the first ohmic contact 317a as the cathode contact. Among other things, the Schottky contact 118, 218 advantageously simplifies the photodiode 100, 200, 200', 200" by eliminating a need for the electrode layer 315 of the conventional UTC photodiode.

Advantageously, the Schottky contact 118, 218 offers specific performance advantages that allow a faster response time and higher efficiency than are possible with an ohmic contact. Additionally, the Schottky contact 118, 218 can provide a lower effective series resistance than is possible with an ohmic contact in this application. A lower series resistance reduces the response time of the photodiode 100, 200, 200', 200". Moreover, in the vertically illuminated embodiment of the photodiode 100 represented by FIG. 5A, the light reflection from the Schottky metal contact can be greater than that from an ohmic contact, resulting in a higher efficiency than possible from a photodiode employing an ohmic contact.

Figure 7:
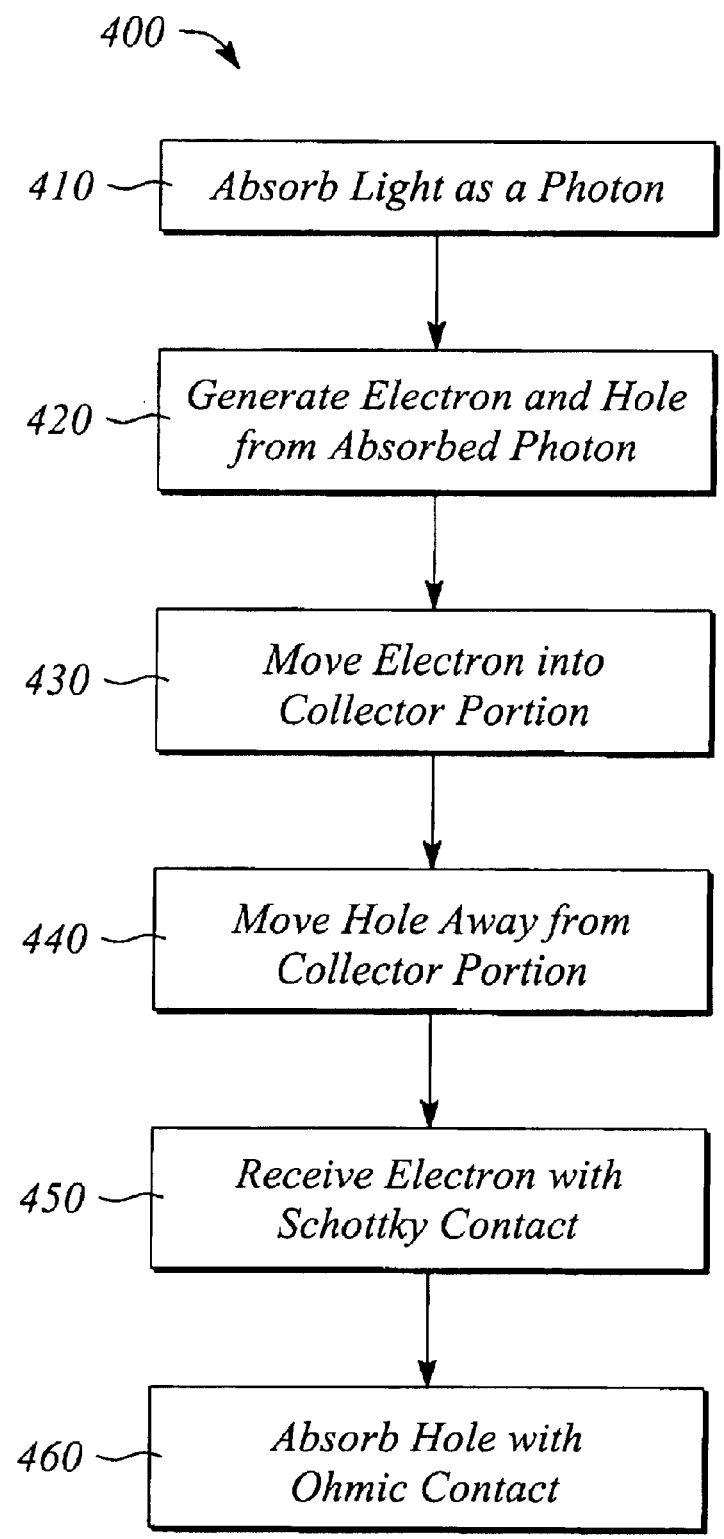
FIG. 7 illustrates a flow chart of a method of detecting incident light using a Schottky contact unipolar photodiode according to an embodiment of the present invention.

FIG. 7 illustrates a method 400 of detecting incident light using a Schottky contact unipolar photodiode according to the present invention. The method 400 comprises absorbing 410 light in the form of photons in a photo-active portion of the photodiode. The method 400 further comprises generating 420 an electron and a hole from an absorbed photon. The method 400 further comprises preferentially moving 430 the generated electron into a collector portion of the photodiode while simultaneously preferentially moving 440 the hole away from the collector portion. In some embodiments, preferentially moving 430 the generated electron comprises employing a carrier block layer having a band gap greater than that of the light absorption portion on a side of the light absorption portion opposite that of the collector portion. The band gap difference between the light absorption portion and the carrier block layer effectively impedes the flow of electrons towards the carrier block layer thereby causing electrons to preferentially move towards the collector portion. In other embodiments, a graded band gap or a graded doping concentration may be employed to generate a quasi-field that preferentially moves 430 the electrons toward the collector portion of the photodiode.

The electric field in the collector portion and the band gap difference between the collector portion and the light absorption portion effectively prevent holes from moving into the collector portion thereby preferentially moving 440 the holes away from the collector portion. Furthermore, the electromotive force to maintain the continuity of photocurrent throughout the photodiode and external circuit preferentially moves 440 the holes away from the collector portion and toward the ohmic contact.

The method 400 further comprises receiving 450 the generated electrons from the collector portion with a Schottky metal contact. In particular, the electrons received by the Schottky metal contact are those that are generated in the light absorption portion and travel through the collector portion. The Schottky metal contact acts as a cathode of the photodiode. The method 400 may further comprise absorbing 460 holes at an ohmic contact acting as an anode contact.

Figure 8:
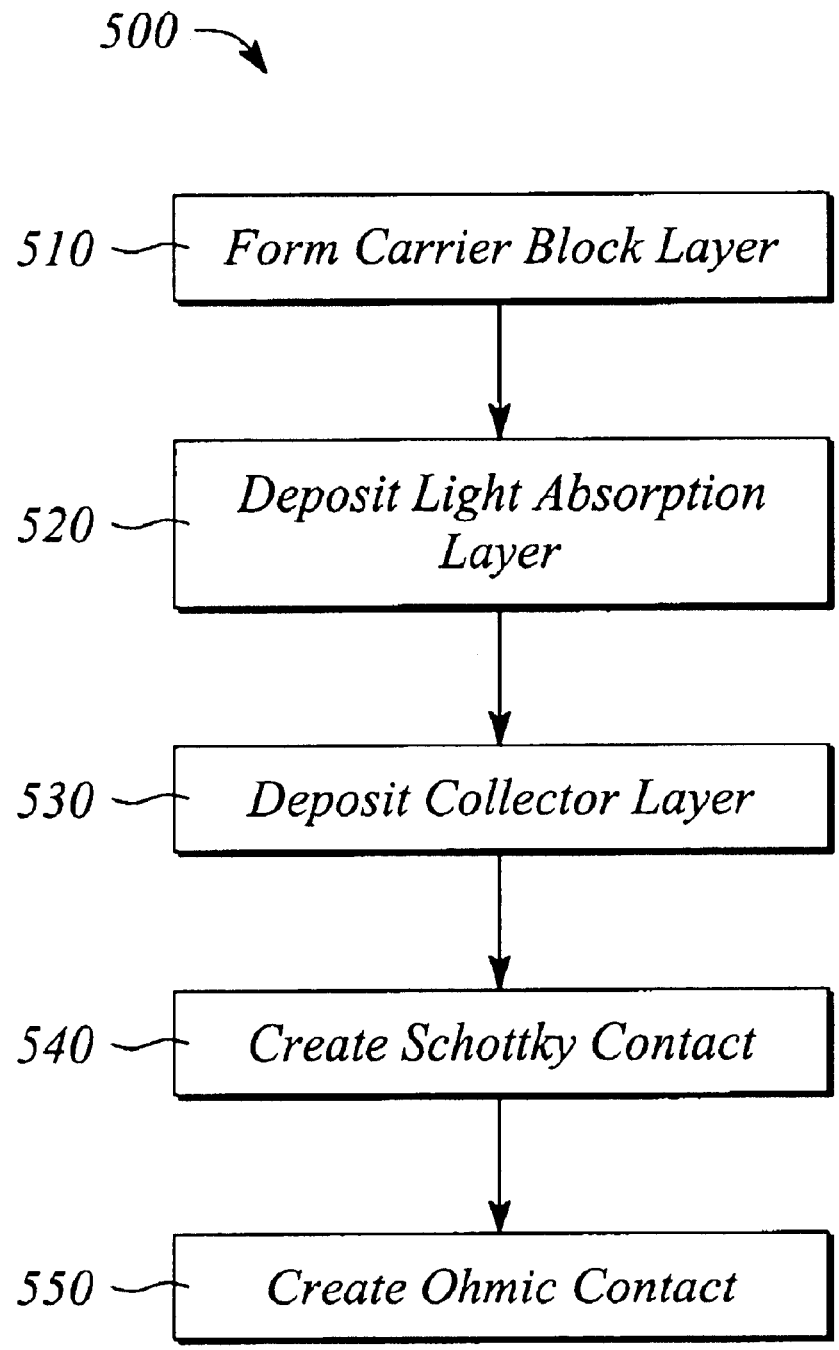
FIG. 8 illustrates a flow chart of a method of constructing a Schottky contact unipolar photodiode according to an embodiment of the present invention.

FIG. 8 illustrates a flow chart of a method 500 of constructing a Schottky contact unipolar photodiode according to the present invention. The method 500 comprises forming 510 a carrier block layer on or in a top surface of a semi-insulating substrate. The carrier block layer may be formed 510 using an epitaxial deposition of a semiconductor layer on the top surface of the semi-insulating substrate. Any and all methods of epitaxial deposition suitable for semiconductor layer deposition may be employed to form 510 the carrier block layer. For example, a p-type III-V compound semiconductor may be formed 510 using molecular-beam epitaxy (MBE) or metal-organic chemical vapor deposition (MOCVD) for epitaxial deposition. Alternatively, the carrier block layer may be formed 510 within the top surface of the semi-insulating substrate by selective doping of the substrate such as by ion implantation. Selective doping forms 510 the carrier block layer as a 'well' within the lattice of the semi-insulating substrate. Preferably, the formed 510 carrier block layer has the characteristics of the carrier block layer 116 described hereinabove with respect to the Schottky contact unipolar photodiode 100.

The method further comprises depositing 520 a light absorption layer on top of the formed 510 carrier block layer. The deposition 520 may be by way of epitaxial deposition or any other deposition methodology known in the art and suitable for semiconductor manufacturing. For example, a p-type III-V compound semiconductor may be deposited 520 on top of carrier block layer using MBE or MOCVD. Preferably, the deposited 520 light absorption layer is similar to and has characteristics of the light absorption layer 112 described hereinabove with respect to the Schottky contact unipolar photodiode 100.

The method further comprises depositing 530 a collector layer on top of the light absorption layer. The deposition 530 may be by way of epitaxial deposition or any other deposition methodology suitable for manufacturing semiconductors. For example, an n-type or undoped III-V compound semiconductor may be deposited 530 on top of the light absorption layer using MBE or MOCVD. Preferably, the deposited 530 light absorption layer is similar to and has characteristics of the collector layer 114 described hereinabove with respect to the Schottky contact unipolar photodiode 100.

The method further comprises creating 540 a Schottky contact on a top surface of the collector layer. The Schottky contact may be created on the top surface of the collector layer by any methodology suitable for creating a Schottky contact. In particular, a metal may be evaporated or sputter deposited onto the top surface of the collector layer after any oxide layer that may have formed thereon is removed.

Preferably, the created 540 Schottky contact has characteristics of the Schottky contact 118 described hereinabove with respect to the Schottky contact unipolar photodiode 100. In particular, the created 540 Schottky contact is a cathode contact for the photodiode.

The method optionally further comprises creating 550 an ohmic contact on a top surface in a carrier block layer or in a light absorption layer. The ohmic contact may be created 550 on a top surface in the carrier block layer or a top surface of another layer on top of a top surface of the carrier block layer such as a separated portion of the light absorption layer. The ohmic contact may be created 550 by any methodology suitable for creating an ohmic contact. In particular, a metal may be evaporated or sputter deposited onto a top surface in the carrier block layer or a top surface of another layer on a top surface of the carrier block layer. Preferably, the metal is deposited after any oxide layer that may have formed thereon is removed from the surface. The created 550 ohmic contact preferably has characteristics of the ohmic contact 117 described hereinabove with respect to the Schottky contact unipolar photodiode 100. In particular, the created 550 ohmic contact is an anode contact for the photodiode.

An ohmic anode contact may be formed and connected to the carrier block layer or light absorption layer simultaneously with creating 540 the Schottky contact. Alternatively, the ohmic contact may be formed and connected at another time during the method 500 of constructing. Similarly, etching or another form of mechanical shaping of one or more of the layers of the photodiode may be performed at various times during the method 500 of constructing and still be within the scope of the present invention.

Moreover, while described hereinabove in terms of the construction of the Schottky contact unipolar photodiode 100 according to the present invention, one skilled in the art may readily adapt an embodiment 500' of the method 500 to construct the Schottky contact unipolar photodiode 200, 200', 200" in which the light absorption layer is replaced by a graded band gap layer or a graded doping layer. In particular in the method 500', depositing 520 the light absorption layer may be replaced by depositing 520' a graded band gap or a graded doping layer. Furthermore in the method 500', forming 510 the carrier block layer may be omitted since the carrier block layer is optional for the Schottky contact unipolar photodiode 200, 200', 200" having a graded band gap layer and/or a graded doping concentration layer.

Thus, there has been described several embodiments of a Schottky contact unipolar photodiode, a method of detecting light using a Schottky contact unipolar photodiode, and a method of constructing a Schottky contact unipolar photodiode. It should be understood that the above-described embodiments are merely illustrative of some of the many specific embodiments that represent the principles of the present invention. Those skilled in the art can readily devise numerous other arrangements without departing from the scope of the present invention.

What is claimed is:

1. An unipolar photodiode comprising:
   a carrier traveling or collector layer having a collector band gap energy;
   a light absorption layer adjacent to and in contact with a first side of the collector layer, the light absorption layer having a light absorption band gap energy that facilitates light absorption;
   a Schottky contact adjacent to and in contact with a second side of the collector layer, the second side being opposite to the first side, the Schottky contact being a cathode contact; and an anode contact indirectly interfaced to the light absorption layer, wherein the collector band gap energy is greater than the light absorption band gap energy, such that the collector layer is substantially not light-absorbing.

2. The unipolar photodiode of claim 1, further comprising:

a carrier block layer adjacent to the light absorption layer on a side of the light absorption layer that is opposite to the collector layer, the anode contact being interfaced to the carrier block layer, the carrier block layer having a block band gap energy, the block band gap energy being greater than the light absorption band gap energy, such that a block layer energy barrier is created between the light absorption layer and the carrier block layer.

3. The unipolar photodiode of claim 2, wherein the light absorption layer converts a photon of light into a pair of free carriers comprising an electron and a hole, the electron preferentially moving away from the block layer energy barrier into the collector layer, the electron being accelerated in the collector layer to the Schottky cathode contact, the hole preferentially moving away from the collector layer energy barrier and into the carrier block layer to the anode contact.

4. The unipolar photodiode of claim 3, wherein the band gap energies of the carrier block layer is greater than the band gap energy of the light absorption layer, such that the carrier block layer is non-conducive to light absorption.

5. The unipolar photodiode of claim 2, wherein the light absorption band gap energy of the light absorption layer comprises a graded band gap energy that produces a quasi-field, the graded band gap energy decreasing from a large band gap energy at a first side of the light absorption layer adjacent to the carrier block layer to a relatively smaller band gap energy at a second side of the light absorption layer adjacent to the collector layer, the light absorption layer absorbing light in at least a portion of the light absorption layer.

6. The unipolar photodiode of claim 1, further comprising:

another layer between the anode contact and carrier block layer, the layer indirectly interfacing the anode contact to the carrier block layer.

7. The unipolar photodiode of claim 1, wherein the light absorption band gap energy of the light absorption layer comprises a band gap energy that is graded, the graded band gap energy producing a quasi-field, the graded band gap energy increasing as a function of distance from a first side of the light absorption layer that is adjacent to the collector layer, the anode contact being interfaced to the light absorption layer, a region of the light absorption layer having a higher band gap energy being less conducive to light absorption than a region of the light absorption layer that has relatively lower band gap energy.

8. The unipolar photodiode of claim 1, wherein the light absorption layer has a first conduction type and a first doping concentration, the collector layer having a second doping concentration that is lower than the first doping concentration of the light absorption layer, the first doping concentration maintaining a charge neutrality condition in at least a portion of the light absorption layer.

9. The unipolar photodiode of claim 1, further comprising a semi-insulating substrate that supports the anode contact and further supports the layers and the Schottky cathode contact in a stacked relationship, the stacked relationship comprising a specific order from a surface of the semi-insulating substrate of the light absorption layer, the collector layer, and the Schottky cathode contact, the anode contact being separate from the stacked layers.

10. The unipolar photodiode of claim 9, wherein incident light enters the photodiode from a surface of the semi-insulating substrate different from the surface supporting the stacked layers and moves toward the stacked layers, the incident light being first absorbed as photons by the light absorption layer, the light absorption layer converting a photon into an electron and a hole, the electron then moving in the collector layer toward the Schottky cathode contact from the light absorption layer, while the hole moves toward the anode contact from the light absorption layer.

11. The unipolar photodiode of claim 10, wherein the incident light enters the semi-insulating substrate at the different surface that is either opposite to or adjacent to the surface supporting the stacked layers, vertical illumination of the photodiode being provided from an opposite surface, horizontal or planar illumination of the photodiode being provided from the adjacent surface.

12. An unipolar photodiode comprising:

a first semiconductor layer in a first conduction type having a first doping concentration;

a second semiconductor layer having a second doping concentration lower than the first doping concentration of the first semiconductor layer, the first semiconductor layer being adjacent to and in contact with a first side of the second semiconductor layer;

a Schottky cathode contact adjacent to and in contact with a second side of the second conductor layer, the second side being opposite the first side; and an ohmic anode contact directly or indirectly interfaced to the first semiconductor layer, wherein the first semiconductor layer has a first band gap energy that facilitates absorption of light, the first doping concentration maintaining a charge neutrality condition in at least a portion of the first semiconductor layer, and wherein the second semiconductor layer has a second band gap energy that is non-conducive to light absorption.

13. The unipolar photodiode of claim 12, further comprising:

a third semiconductor layer having a third doping concentration, the third doping concentration being greater than the second doping concentration of the second semiconductor layer, the third semiconductor layer being one of directly or indirectly interfaced to the anode contact, the first semiconductor layer being between the third semiconductor layer and the second semiconductor layer, wherein the third semiconductor layer has a third band gap energy that is non-conducive to light absorption.

14. The unipolar photodiode of claim 13, wherein the first band gap energy of the first semiconductor layer increases as a function of distance from the second semiconductor layer, such that the first semiconductor layer facilitates light absorption in a first region of the first semiconductor layer adjacent to the second semiconductor layer relatively more than in a second region of the first semiconductor layer adjacent to the third semiconductor layer.

15. The unipolar photodiode of claim 13, further comprising a semi-insulating substrate that supports the anode contact and further supports the semiconductor layers and the Schottky cathode contact in a stacked relationship, the stacked relationship comprising a specific order from a surface of the semi-insulating substrate of the third semiconductor layer, the first semiconductor layer, the second semiconductor layer and the Schottky cathode contact, the anode contact being separated from the surface by the third semiconductor layer, the anode contact being further separated from the stacked layers.

16. The unipolar photodiode of claim 12, wherein the first band gap energy of the first semiconductor layer increases as a function of distance from the second semiconductor layer, such that the first semiconductor layer facilitates light absorption in a first region of the first semiconductor layer adjacent to the second semiconductor layer relatively more than in a second region of the first semiconductor layer further away from the second semiconductor layer, the second region of the first semiconductor layer being directly interfaced to the anode contact.

17. The unipolar photodiode of claim 12, wherein the second semiconductor layer comprises an electric field and
wherein the first semiconductor layer converts a photon of light into a pair of free carriers comprising an electron and a hole, the electron preferentially moving into the second semiconductor layer and being accelerated by the electric field gradient toward the Schottky cathode contact, the hole preferentially moving toward the anode contact.

18. The unipolar photodiode of claim 12, further comprising a semi-insulating substrate that supports the anode contact and further supports the semiconductor layers and the Schottky cathode contact in a stacked relationship, the stacked relationship comprising a specific order from a surface of the semi-insulating substrate of the first semiconductor layer, the second semiconductor layer, and the Schottky cathode contact, the anode contact being separated from the stacked semiconductor layers.

19. The unipolar photodiode of claim 18, wherein incident light enters the photodiode from a surface of the semi-insulating substrate different from the surface supporting the stacked semiconductor layers and moves toward the stacked layers, the incident light being first absorbed as photons by the first semiconductor layer, the first semiconductor layer converting a photon into an electron and a hole, the electron then moving into the second semiconductor layer toward the Schottky cathode contact from the first semiconductor layer, while the hole moves toward the anode contact from the first semiconductor layer.

20. The unipolar photodiode of claim 19, wherein the incident light enters the semi-insulating substrate at the different surface that is either opposite to or adjacent to the surface supporting the stacked semiconductor layers, vertical illumination of the photodiode being provided from an opposite surface, horizontal or planar illumination of the photodiode being provided from the adjacent surface.

21. A method of detecting incident light using a unipolar photodiode comprising:
absorbing light in the form of photons in a photo-active portion of the unipolar photodiode;
generating an electron and a hole from an absorbed photon in the photo-active portion;
preferentially moving the generated electron into a collector portion of the unipolar photodiode;
simultaneously moving the generated hole preferentially away from the collector portion;
receiving the generated electron from the collector portion with a Schottky metal cathode contact of the unipolar photodiode; and
absorbing the generated hole from the photo-active portion with an ohmic anode contact of the unipolar photodiode.
wherein preferentially moving the generated electron comprises employing a carrier block portion in the unipolar photodiode, the carrier block portion being employed adjacent to a first side of die photo-active portion that is opposite to a second side of the photo-active portion to which the collector portion is adjacent, the carrier block portion having a block band gap energy that is greater than a photo-active band gap energy of the photo-active portion, the block band gap energy impeding a flow of the generated electron toward the carrier block layer, the block band gap energy further encouraging the flow of the generated electron preferentially toward the collector portion.

22. The method of claim 21, wherein preferentially moving the generated electron further comprises employing a band gap energy or a doping concentration in the photo-active portion of the unipolar photodiode that is graded, the graded band gap energy or doping concentration generating a quasi-field in the photo-active portion, the quasi-field preferentially moving the generated electron toward the collector portion of the unipolar photodiode.

23. A method of detecting incident light using a unipolar photodiode comprising:
absorbing light in the form of photons in a photo-active portion of the unipolar photodiode;
generating an electron and a hole from an absorbed photon in the photo-active portion;
preferentially moving the generated electron into a collector portion of the unipolar photodiode;
simultaneously moving the generated hole preferentially away from the collector portion;
receiving the generated electron from the collector portion with a Schottky metal cathode contact of the unipolar photodiode; and
absorbing the generated hole from the photo-active portion with an ohmic anode contact of the unipolar photodiode.
wherein preferentially moving the generated electron comprises employing a band gap energy or a doping concentration in the photo-active portion of the unipolar photodiode that is graded, the graded band gap energy or doping concentration generating a quasi-field in the photo-active portion, the quasi-field preferentially moving the generated electron toward the collector portion of the unipolar photodiode.

24. A method of detecting incident light using a unipolar photodiode comprising:
absorbing light in the form of photons in a photo-active portion of the unipolar photodiode;
generating an electron and a hole from an absorbed photon in the photo-active portion;
preferentially moving the generated electron into a collector portion of the unipolar photodiode;
simultaneously moving the generated hole preferentially away from the collector portion;
receiving the generated electron from the collector portion with a Schottky metal cathode contact of the unipolar photodiode; and
absorbing the generated hole from the photo-active portion with an ohmic anode contact of the unipolar photodiode,
further comprising illuminating the unipolar photodiode with the incident light, the unipolar photodiode being illuminated at a surface of a semi-insulating substrate, the semi-insulating substrate supporting the unipolar photodiode portions on a different surface, the illuminated surface being either parallel or perpendicular to the different surface that supports the unipolar photodiode portions to provide either vertical illumination or planar illumination to the unipolar photodiode, respectively.

* * * * *